United States Patent [19]

Hayashi

[11] Patent Number: 4,871,884
[45] Date of Patent: Oct. 3, 1989

[54] ELECTRICAL CONNECTING BOX
[75] Inventor: Hideharu Hayashi, Shizuoka, Japan
[73] Assignee: Yazaki Corporation, Tokyo, Japan
[21] Appl. No.: 183,951
[22] Filed: Apr. 20, 1988
[30] Foreign Application Priority Data Apr. 22, 1987 [JP] Japan .............................. 62-59858[U]

[51] Int. Cl.$^4$ .............................................. H05K 5/00
[52] U.S. Cl. ............................ 174/52.1; 220/DIG. 6; 361/399
[58] Field of Search ............. 174/52 R, 17 VA, 17 R; 220/DIG. 6; 439/34; 200/306; 361/392, 394, 395, 399, 407

[56] References Cited

U.S. PATENT DOCUMENTS 4,580,607 4/1986 Cantele ..................... 220/DIG. 6

FOREIGN PATENT DOCUMENTS 2120853 12/1983 United Kingdom ................ 200/306

Primary Examiner—Arthur T. Grimley
Assistant Examiner—David A. Tone
Attorney, Agent, or Firm—Sughrue, Mion, Zinn, Macpeak & Seas

[57] ABSTRACT

An electrical connecting box having improved water discharging properties. The connecting box includes a box body and a bus bar circuit board. The bus bar circuit board is sloped to defined a sloped surface having a predefined angle of inclination from a horizontal plane. This may be done either by mounting the box body at an inclined angle, or by inclining the bus bar circuit board with respect to the box body. A water discharge hole is formed in a bottom plate of the box body.

4 Claims, 3 Drawing Sheets

ELECTRICAL CONNECTING BOX

BACKGROUND OF THE INVENTION

The present invention relates to an improvement of an electrical connecting box to be installed on a vehicle, in which water is naturally discharged therefrom to prevent the occurrence of leakage current in bus bar circuit boards or the like mounted in the box.

The construction of a conventional electrical connecting box, such as a junction box or a relay box, is generally as shown in FIG. 1.

In FIG. 1, reference numeral 1 designates a bus bar circuit board on both sides of which bus bar circuits 2 are provided; 3, a top plate on which are mounted connector housings 4, to which, for instance, relays are connected.

In general, a plurality of bus bar circuit boards 1 are provided in a multi-layered arrangement. In each of the bus bar circuit boards, tab terminals extend upwardly and downwardly from the bus bar circuits 2, and some of the tab terminals of the bus bar circuit boards 1 located between the uppermost and lowermost bus bar circuit boards, extend upwardly through the uppermost bus bar circuit board or downwardly through the lowermost bus bar circuit board.

The tab terminals 5 are inserted into the connector housings 4 mounted on the top cover 3 placed over the bus bar circuit boards 1 or into connector housings provided on the bottom plate 6a of the box body 6.

The top plate 3 and the bus bar circuit board 1 are placed in the box body 6. The upper opening of the box body 6 is covered with a waterproof cover 7, and the lower opening of the box body 6 is covered with a connector cover 8, as shown in FIG. 2, which is the bottom wall of the electrical connecting box. The electrical connecting box further includes mounting brackets 9 which ar connected to the body of the vehicle with bolts or the like.

As described above, the upper and lower openings of the box body 6 are covered with the waterproof cover 7 and the connector cover 8, respectively. However, sometimes water may enter the electrical connecting box through gaps between the covers and the box body when installed on a vehicle, especially when installed in the engine compartment, due to splashing of water from the road or due to water condensation arising from large temperature changes. Furthermore, when the vehicle is washed, water may enter the box through the gaps.

Water entering the electrical connecting box, as shown in FIG. 3, can fall on the uppermost bus bar circuit board 1 through a terminal inserting hole 4a formed in the connector housing 4, thus wetting the bus bar circuit 2A on the bus bar circuit board 1. As a result, the bus bar circuit 2A may suffer from current leakage.

The male terminals 5 extending outwardly from the bus bar circuits 2A and 2B of the bus bar circuit boards 1 are engaged with female-female terminals 10. Water droplets G from the bus bar circuit may contact the two female-female connectors 10 or collect between two bus bars having a potential difference, thus causing current leakage.

Therefore, water droplets G entering the electrical connecting box should not be retained on the bus bar circuit; that is, it is essential to quickly remove water droplets G from the electrical connecting box. However, there has been no suitable means for quickly removing such water droplets G from the space over the bus bar circuit covered by the top plate 3.

SUMMARY OF THE INVENTION

Accordingly, an object of the present invention is to eliminate the above-described difficulties accompanying a conventional electrical connecting box. More specifically, an object of the invention is to provide an electrical connecting box in which water droplets entering the box can be automatically and quickly expelled therefrom without using an intricate water removing system.

According to the invention, an electrical connecting box comprises a box body and a bus bar circuit board provided in the box body in such a manner that a plate-shaped member such as the bus bar circuit board is inclined, and a water discharge hole is formed in a bottom plate of the box body to discharge from the box water droplets flowing down the sloped surface of the bus bar circuit board or the like.

When water entering the electrical connecting box falls in the form of water droplets onto the bus bar circuit board, the water droplets are allowed to smoothly flow down, and out of the box because the bus bar circuit board is inclined.

Accordingly, the electrical connecting box of the invention is free from the difficulty of water spreading over the bus bar circuits causing short-circuits and leakage current flows in the bus bar circuit.

Furthermore, even if water droplets are retained on female-female terminals fitted on the tab terminals extending from the bus bar circuit board, such droplets will not spread to the extent that they can short-circuit the female-female terminals, that is, such droplets will quickly flow down the sloped surface. Hence, no leakage current flows between the female-female terminals.

DESCRIPTION OF THE PREFERRED EMBODIMENTS

Figure 1:
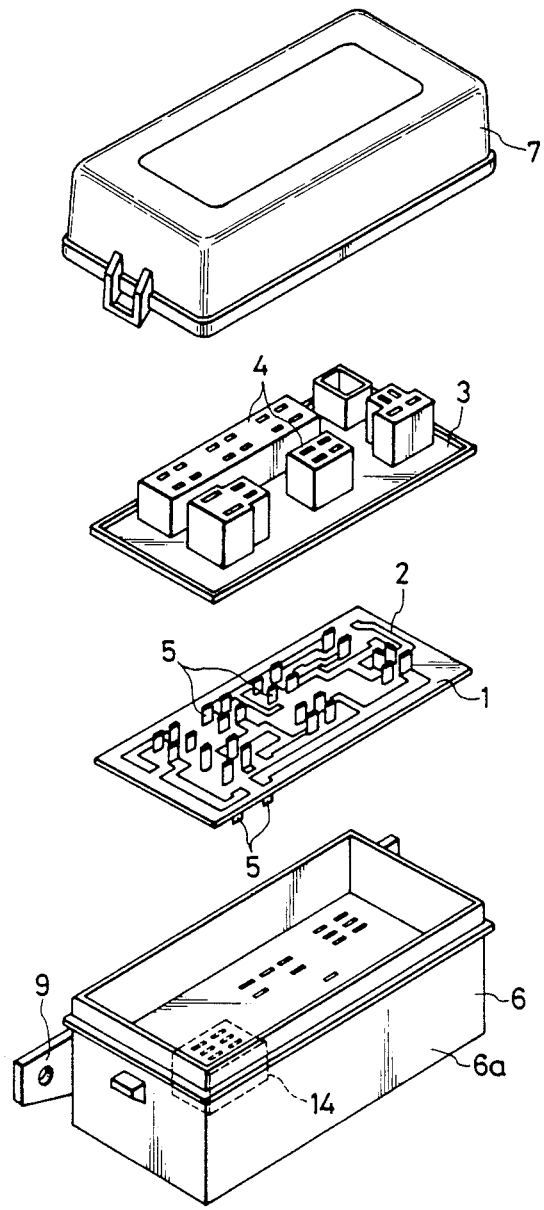
FIG. 1 is an exploded perspective view showing essential components of a conventional electrical connecting box.
Figure 2:
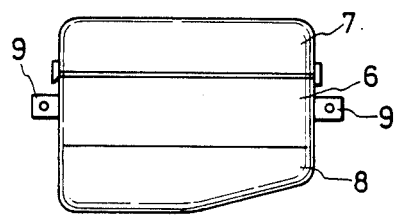
FIG. 2 is a front view showing an example of a conventional electrical connecting box.
Figure 3:
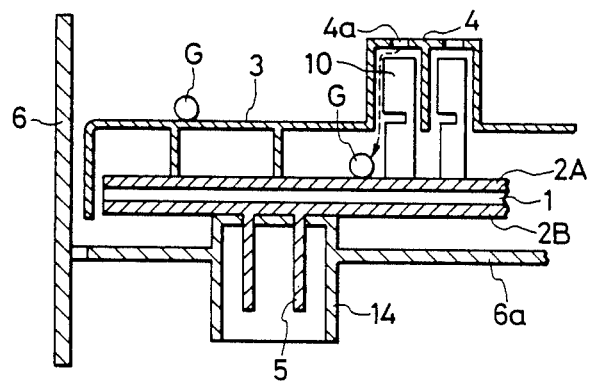
FIG. 3 is a sectional view showing essential components of the conventional electrical connecting box.

Preferred embodiments of the invention will be described with reference to FIGS. 4 through 6, in which those components which have been described with reference to FIGS. 1 through 3 showing a conventional electrical connecting box are designated by the same reference numerals or characters.

Figure 4:
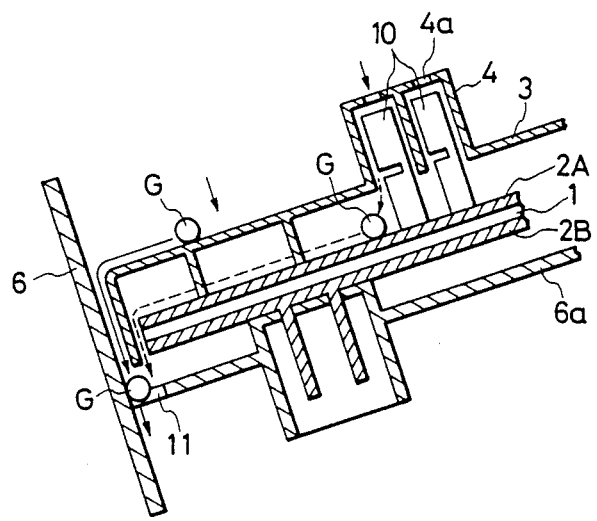
FIG. 4 is a sectional view showing an example of an electrical connecting box according to the invention.
Figure 5:
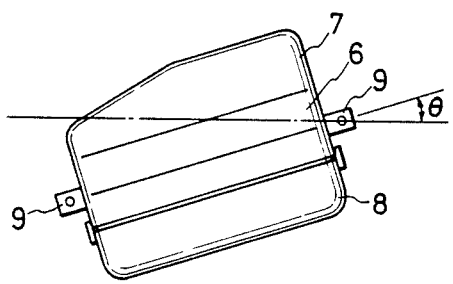
FIG. 5 is a front view showing the electrical connecting box in an inclined state.

In the electrical connecting box of the invention, as shown in FIG. 4, a bus bar circuit board 1 and a top plate 3 placed in a box body 6 are inclined at least about 5° so that water droplets are forced to flow along the board 1 and the plate 3 by force of gravity.

The above-described angle of inclination can be imparted to the bus bar circuit board 1 and the top plate 3 by two methods. In one of the methods, the electrical connecting box is designed so that the bus bar circuit board 1 and the top plate 3 are inclined with respect to the box body 6. In the other method, the conventional electrical connecting box, in which the bus bar circuit board 1 and the top plate 3 are mounted horizontally, with respect to the box body 6, is inclined as shown in FIG. 5 when installed on the vehicle so that the angle of inclination ($\theta$) of the bus bar circuit board 1 and the top plate 3 is at least 5° so as to cause the water droplets to naturally flow down along the bus bar circuit board 1 and the top plate 3.

FIG. 4 illustrates the case where the bus bar circuit board 1 and the top plate 3 are inclined by the latter method.

In this case the bottom plate 6a of the box body 6 is also inclined. Therefore, if a water discharge hole 11 is formed in the bottom plate at the lower end, water droplets G falling on the bottom plate 6a can be collected at the lower end of the bottom plate 6a and discharged through the water discharge hole 11.

Figure 6:
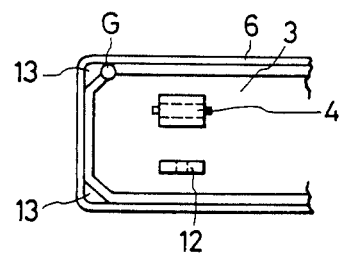
FIG. 6 is a plan view showing essential components of a top plate in the electrical connecting box of FIG. 4.

As shown in FIG. 6, a connector housing 4 holding female-female connectors 10 which are electrically connected, for instance, to the terminals of a relay, and a housing 12 for accommodating a fuse are mounted on the top plate 3. It is necessary to prevent, the accumulation of water droplets G on the top plate 3. For this purpose, the upper surface of the top plate is sloped, and water discharge holes 13 are formed in the sloped surface at both ends of the lower edge.

Water falling down the water discharge holes 13 is allowed to pass through the water discharge hole 11 formed in the bottom plate 6a and a water discharge hole formed in the connector cover 8 so that it is discharged from the electrical connecting box.

If water enters the electrical connecting box thus constructed and water droplets fall on the top plate 3 and on the bus bar circuit board 1 through the connector housing 4 mounted on the top plate, since the top plate 3 and the bus bar circuit board 1 are sloped as described above, the water droplets flow down to the lower edges of the sloped surfaces and pass through the water discharge hole 11, the water is finally discharged from the electrical connecting box through the water discharge hole formed in the connector cover.

Accordingly, the electrical connecting box of the invention is free from the difficulty of water droplets G spreading over the bus bar circuit board and causing leakage current to flow in the bus bar circuit board or between the female-female terminals thereof.

As described above, in the electrical connecting box of the invention, the bus bar circuit board, the top plate, etc., are inclined with respect to the box body so that water droplets are naturally caused to flow out of the box. That is, water can be discharged from the box with no intricate mechanism. More specifically, the water falling down from the lower edge of each sloped surface is naturally discharged through the water discharge hole; that is, water is smoothly discharged from the electrical connecting box at all times. Therefore, the leakage current problem accompanying the conventional electrical connecting box is eliminated according to the invention.

I claim:

1. In an electrical connecting box comprising a box body and a bus bar circuit board provided in said box body, the improvement wherein:

said bus bar circuit board defines a sloped surface having an angle of inclination from a horizontal plane, which is parallel to a horizontal road, wherein said electrical connecting box further comprises a top plate disposed over said bus bar circuit board, said top plate have a portion disposed transverse to said bus bar circuit board and forming a gap between said transverse portion and said bus bar circuit board; and at least one water discharge hole for discharging from said electrical connecting box water droplets falling on said bus bar circuit board and flowing down said sloped surface is formed in the bottom plate of said box body directly below said gap between said transverse portion and said bus bar circuit board.

2. The electrical connecting box as claimed in claim 1, wherein said electrical connecting box is mounted on a vehicle in such a manner that said electrical connecting box is inclined with respect to said vehicle, said bus bar circuit board having an angle of inclination with respect to said vehicle.

3. The electrical connecting box of claim 1, wherein said angle of inclination is at least 5%.

4. The electrical connecting box of claim 1, wherein said bus bar circuit board is inclined with respect to said box body.

* * * * *